SEMICONDUCTOR AMPLIFIER

Filed July 6, 1965

INVENTOR.
NAIF D. SALMAN

BY [signature]

ATTORNEY

United States Patent Office 3,458,828

Patented July 29, 1969

3,458,828

SEMICONDUCTOR AMPLIFIER

Naif D. Salman, Orange, Calif., assignor to North American Rockwell Corporation

Filed July 6, 1965, Ser. No. 469,766

Int. Cl. H03f *3/04*

U.S. Cl. 330—24 13 Claims

ABSTRACT OF THE DISCLOSURE

A relatively high input impedance is provided for a semiconductor amplifier by utilizing a diode having a D.C. current applied thereto so that the diode operates on the lower portion of its forward bias I–V curve whereby the diode is effective to provide the relatively high impedance.

This invention relates to a semiconductor amplifier and, more specifically, to a semiconductor amplifier utilizing a new and improved input impedance.

When it is necessary to employ a relatively high input impedance for an amplifier, the resistances normally occupy a relatively large space. If the circuit is to be diffused into a single semiconductor block, relatively long paths in the block are necessary to produce a relatively high resistance.

A feature of the present invention is to utilize a diode as an input impedance for the amplifier. A relatively small forward bias is applied to the diode so that the diode in effect is on the lower portion of its I–V curve and as a result is effective to become a relatively high impedance.

Therefore, an object of the invention is to provide a relatively high impedance for an amplifier in a relatively small space.

Another object of the invention is the provision of an input impedance for an amplifier which can be varied with a high degree of accuracy.

Still another object of the invention is the provision of an input impedance for an amplifier which is effective to stabilize the amplifier.

These and other objects of the invention will become apparent from a reading of the following specification and an examination of the drawing in which.

Figure 1:
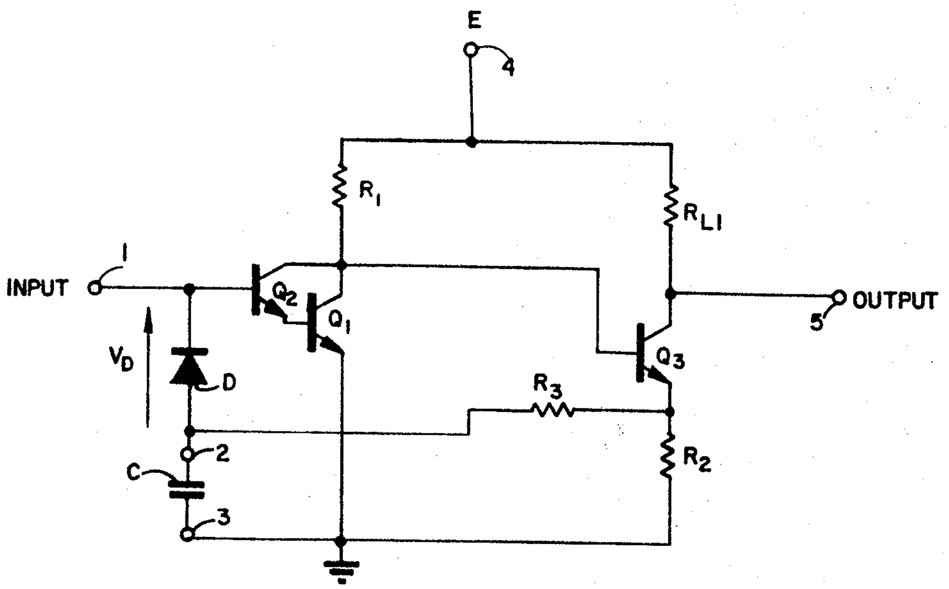
FIG. 1 illustrates an amplifier embodying the invention.

The amplifier in FIG. 1 includes a pair of input terminals 1 and 3 and an output terminal 5 which receives the alternating current output between terminal 5 and ground. Connected in series with input terminals 1 and 3 is a capacitor C which is connected between terminals 2 and 3 and a P-N junction diode D. Input terminal 1 as well as the cathode of diode D is connected to the base of a transistor $Q_2$. Another transistor $Q_1$ is connected into a Darlington configuration with $Q_2$ with the collectors of $Q_1$ and $Q_2$ connected together and the emitter of $Q_2$ connected to the base of $Q_1$. The emitter of $Q_1$ is in turn connected to ground. The collectors of $Q_1$ and $Q_2$ are connected to the base of a transistor $Q_3$. A voltage supply E is connected to a terminal 4 as well as to resistors $R_1$ and $R_{L1}$. The other terminal of resistor $R_1$ is connected to the collectors of transistors $Q_2$ and $Q_1$ to provide bias thereto, whereas the other terminal of resistor $R_{L1}$ is connected to the collector of transistor $Q_3$ to provide bias. A feedback resistor $R_3$ is connected between the emitter of $Q_3$ and the anode of P-N diode D. This feedback resistor provides a D.C. current path from supply E through resistor $R_{L1}$, transistor $Q_3$, resistor $R_3$, P-N diode D, the base-emitter junctions of $Q_1$ and $Q_2$ to ground. In this manner, there is provided a predetermined forward bias on diode D so as to provide a relatively high input impedance. In addition, resistor $R_3$ provides an A.C. ground return through capacitor C. Resistor $R_2$ is employed to effect the proper bias on transistor $Q_3$.

Diode D is a P-N junction type diode having the typical characteristic I–V curve of such a diode. An example of the impedance that can be realized with such a diode can be seen if the diode is forward biased by one microampere of current. Under such circumstances, the diode will present an impedance to the incoming A.C. current of 26,000 ohms. If the diode is forward biased by 2.6 microamperes of current, it will provide an effective impedance of 10,000 ohms. Thus, it is seen that by biasing diode D into a lower portion of its I–V curve the impedance can be accurately determined by the forward bias effected by power supply E. In addition, if it is desired to fabricate the circuit onto a semiconductor block by standard diffusion techniques, a small P-N junction is easily fabricated to effect diode D. It will be understood that the alternating current input signal will not have a large enough amplitude to overcome the forward bias on diode D.

Figure 2:
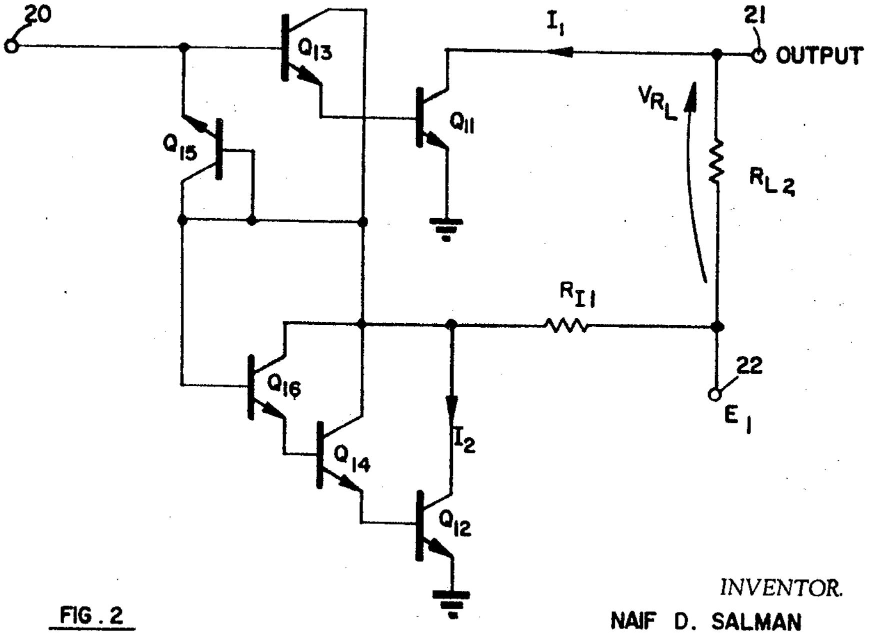
FIG. 2 illustrates still another amplifier embodying the invention.

A second embodiment is shown in FIG. 2 wherein the amplifier has an input terminal 20 with the A.C. input signal connected between input terminal 20 and ground. In the embodiment illustrated in FIG. 2, rather than having a standard P-N junction diode, a transistor $Q_{15}$ is employed wherein the collector and base are connected together so that the base-emitter junction is utilized as the forward bias diode. In this configuration, the amplifier employs a transistor $Q_{13}$ with its base connected to input terminal 20 and the emitter of $Q_{15}$. The collector of $Q_{13}$ is connected to the base and collector of $Q_{15}$ as well as to the collectors of transistors $Q_{12}$, $Q_{14}$, and $Q_{16}$. The emitter of $Q_{13}$ is connected to the base of a transistor $Q_{11}$ whose emitter is grounded and whose collector is connected to an output terminal 21. A bias supply $E_1$ is connected to a terminal 22 as well as to resistors $R_{L2}$ and $R_{I1}$. The other terminal of resistor $R_{I2}$ is connected to output terminal 21. The other terminal of $R_{I1}$ is connected to the collectors of $Q_{12}$, $Q_{14}$, and $Q_{16}$. These transistors operate as a voltage and current regulator. More specifically, the voltage regulator is effected by the base-emitter junctions of $Q_{12}$, $Q_{14}$, and $Q_{16}$ that are connected in series between the base and collector of $Q_{15}$ and ground. Current coming from the supply $E_1$ goes upwardly through resistor $R_{L3}$ which current is designated as $I_1$. In addition, current substantially equal to $I_1$ from $E_1$ passes through $R_{I1}$ and the collector-emitter paths of $Q_{12}$, $Q_{14}$, and $Q_{16}$. Thus, transistors $Q_{12}$, $Q_{14}$, and $Q_{16}$ operate as voltage and current regulators.

The base-emitter junction of $Q_{15}$ is forward biased by a current path from $E_1$, through $R_{I1}$, the base-emitter junctions of $Q_{15}$, $Q_{13}$ and $Q_{11}$. The base-emitter junction of $Q_{15}$ operates in the same manner as a P-N diode. This embodiment however is useful when a transistor is already available.

Although the invention has been described and illustrated in detail, it is to be clearly understood that the same is by way of illustration and example only and is not to be taken by way of limitation, the spirit and scope of the invention being limited only by the terms of the appended claims.

I claim:

1. In combination:

means having an input and an output terminal for amplifying a signal applied to said input terminal;

a P–N junction device connected to said input terminal in such a manner so as to be forward biased by the normal flow of amplifier bias current into said input terminal; and means operatively coupled to said P–N junction device for coupling a D.C. bias current thereto, the magnitude and sign of said D.C. current being such as to cause said P–N junction device to operate on the lower portion of its I–V curve whereby said P–N junction device operates as a relatively high input impedance for said amplifying means.

2. The combination of claim 1 wherein said P–N junction device is a semiconductor diode.

3. The combination of claim 1 wherein said means for coupling a D.C. current includes:

means for adjusting said D.C. current whereby said input impedance may be varied.

4. The combination of claim 1 further comprising:

means for voltage and current regulating the bias of said amplifying means.

5. The combination of claim 1 wherein said amplifying means is a semiconductor amplifier.

6. In combination:

an amplifier having a pair of input terminals adapted to receive a signal to be amplified;

a P–N junction device having first and second terminals, said first P–N junction device terminal being connected to one of said input terminals in such a manner as to be forward biased by the normal flow of amplifier bias current into said one input terminal; and means operatively coupled between said second P–N junction device terminal and the other of said input terminals for coupling a D.C. bias current to said P–N junction device so as to cause said P–N junction device to operate on the lower portion of its forward bias I–V curve whereby said P–N junction device provides a relatively high input impedance for said amplifier.

7. The combination of claim 6 wherein said P–N junction device is a semiconductor diode.

8. The combination of claim 6 wherein said means for coupling a D.C. current includes:

means for adjusting said D.C. current whereby said input impedance may be varied.

9. The combination of claim 6 wherein said amplifier is a transistor amplifier.

10. Means adapted for use at the input terminal of a semiconductor amplifier for providing said amplifier with a relatively high input impedance, said means comprising in combination:

a P–N junction device connected to said input terminal in such a manner so as to be forward biased by the normal flow of amplifier bias current into said input terminal; and means operatively coupled to said P–N junction device for coupling a D.C. bias current thereto, the magnitude and sign of said D.C. current being such as to cause P–N junction to operate on the lower portion of its forward bias I–V curve whereby said P–N junction device operates as a relatively high input impedance for said amplifier.

11. The combination of claim 10 wherein said P–N junction device is a semiconductor diode.

12. A bias circuit for a transistor circuit having a plurality of transistors each having base and emitter electrodes, the plurality of circuit transistors being coupled in series with the emitter electrode of each of the circuit transistors being coupled to the base electrode of the circuit transistor following in the series and the emitter electrode of the last circuit transistor in the series being coupled to a reference potential, said bias circuit including in combination, power supply means, a terminal point, first circuit means coupling said terminal point to the base electrode of the first circuit transistor in the series, a plurality of bias transistors equal in number to the plurality of circuit transistors, said plurality of bias transistors being coupled to form a Darlington string and having an output circuit coupled to said power supply means and an input circuit, second circuit means coupling said input circuit to said terminal point, third circuit means coupling said power supply means to said terminal point to establish a first current through said Darlington string, said Darlington string being responsive to said first current therethrough to develop a potential at said terminal point, the transistor circuit being responsive to said potential at said terminal point to establish a second current substantially equal to said first current through said plurality of circuit transistors.

13. A bias circuit for a transistor amplifier having first and second amplifier transistors each having base and emitter electrodes, the emitter electrode of the first amplifier transistor being coupled to the base electrode of the second amplifier transistor, and a circuit coupling the emitter electrode of the second amplifier transistor to a reference potential, said bias circuit including in combination, power supply means, a terminal point, first diode means coupling said terminal point to the base electrode of the first amplifier transistor to provide a high input impedance to the transistor amplifier, first and second bias transistors having base, collector, and emitter electrodes, said emitter electrode of said first bias transistor being connected to said base electrode of said second bias transistor and said collector electrodes of said first and second bias transistors being coupled to said terminal point to form a Darlington string, second circuit means coupling said emitter electrode of said second bias transistor to said power supply means, second diode means coupling said terminal point to said base electrode of said first bias transistor, resistance means coupling said power supply means to said terminal point to establish a first current through said Darlington string, said Darlington string being responsive to said first current therethrough to develop a potential at said terminal point, the first and second amplifier transistors being responsive to said potential at said terminal point to establish a second current substantially equal to said first current through said first and second amplifier transistors.

No references cited.

ROY LAKE, Primary Examiner

L. J. DAHL, Assistant Examiner

U.S. Cl. X.R.

330—22